TRANSISTOR CLOCKED PULSE AMPLIFIER

Filed Aug. 22, 1956 2 Sheets-Sheet 1

INVENTOR
R. H. MATTSON
BY Patrick J. Roche
ATTORNEY

TRANSISTOR CLOCKED PULSE AMPLIFIER

Filed Aug. 22, 1956

2 Sheets-Sheet 2

INVENTOR
R. H. MATTSON
BY Patrick J. Roche
ATTORNEY

United States Patent Office 2,961,551

Patented Nov. 22, 1960

2,961,551

TRANSISTOR CLOCKED PULSE AMPLIFIER

Roy H. Mattson, New Providence, N.J., assignor to Bell Telephone Laboratories, Incorporated, New York, N.Y., a corporation of New York Filed Aug. 22, 1956, Ser. No. 605,625

2 Claims. (Cl. 307—88.5)

This invention relates to multi-stage transistor amplifiers, and more specifically to tandem, direct-coupled, pulse amplifiers which employ junction transistors.

In certain digital computer systems it is desirable to employ amplifiers as pulse regenerators between stages of logic circuitry. Therefore, the pulse regenerator must supply the maximum possible output current to drive succeeding logic stages. Such a pulse regenerator may also be required to amplify rectangular pulses which are occurring at a megacycle rate of frequency. The pulse regenerator operation is usually synchronized with the operation of other pulse regenerators in the computer by means of an alternating clock voltage to assure orderly processing of data through the computer so its actual regenerating operation may be delayed during each cycle by the synchronizing control source. Accordingly, the regenerator must be able to switch rapidly between Off and On conditions to produce sharp pulses in the regenerator output circuit even though the production of sharp rectangular pulses may involve driving the amplifier into saturated conduction.

It is easy enough to boost the output current of a pulse regenerator by simply inserting additional stages of amplification in tandem where necessary. However, the insertion of more than one stage of amplification requires interstage coupling circuits which generally impose an upper limit on the amplifier frequency handling capabilities and thus restrict the amplifier switching speed. Amplifiers may be connected in tandem by employing either an alternating current coupling device such as a capacitor or a transformer, or a direct current coupling device such as a resistor or a direct wire connection.

Alternating current circuit elements tend to make the problem of planning each individual amplifier stage relatively straightforward because the stages are substantially independent of one another, but since such circuit elements tend to store energy during operation sufficient time must be allowed between input pulses to permit these interstage coupling devices to be restored to their normal nonconducting condition by the dissipation of the energy stored therein. The time interval required for such restoration necessarily fixes the minimum time spacing between amplifier input pulses and thereby limits the pulse repetition frequency of the entire computer system.

Direct-coupled transistor amplifiers have been heretofore devised utilizing tandem connected amplification stages which employ transistors of either the same or of opposite conductivity types. Direct-coupled amplifier stages eliminate the use of alternating current impedances in interstage coupling networks and thereby tend to reduce the effect of such interstage coupling networks in limiting the amplifier pulse repetition rate. However, it has been found that the elimination of the one limitation serves to emphasize another limitation which is present in both alternating current and direct current coupled amplifier stages. This latter limitation has been found to comprise the interior functioning of the transistor itself, that is, the time required by the transistor to switch from an Off condition to an On condition which involves conducting normally or with collector current saturation and to switch to the Off condition from either the normal On condition or the saturated On condition.

Therefore, it is one object of the present invention to improve the pulse transmission characteristics of multistage transistor amplifiers.

Another object is to improve the switching characteristic of a plurality of junction transistors connected in a direct-coupled multi-stage amplifier.

Still another object is to reduce the number of interstage coupling components required for direct-coupled multi-stage transistor amplifiers while at the same time improving the frequency response characteristics thereof.

A further object is to utilize an inherent characteristic of junction transistors for improving the frequency response of a direct-coupled, clocked, pulse amplifier including such transistors while at the same time reducing the number of interstage coupling components therefor.

These and other objects of the invention are carried out in an exemplary embodiment thereof by connecting n-p-n and p-n-p transistors in tandem in a common emitter, two-stage amplifier in which the emitter electrodes are connected to a reference potential point; the n-p-n collector electrode is directly connected to the p-n-p base electrode; and a source of alternating current clocking potential and a diode are connected in series between the reference potential point and the direct connection. No other interstage connections are provided. The input is applied to the base electrode of the n-p-n transistor and ground, and the output is taken from the collector electrode of the p-n-p transistor and ground. No feedback connections are provided between the collector electrode of the p-n-p transistor and the base electrode of the n-p-n transistor so the input circuit is independent of the output circuit.

In the absence of a triggering pulse, the n-p-n transistor is biased Off by a reverse bias potential applied between its base and emitter electrodes. The associated clock potential source and diode, in cooperation with the inherent interelectrode capacitance of the base-collector junction of the n-p-n transistor, serve to reverse bias the latter junction. At the same time, the associated clock potential source and diode, in cooperation with the inherent interelectrode capacitance of the base-emitter junction of the p-n-p transistor, serve to maintain a reverse bias on the latter junction to preclude premature triggering of the transistor by noise voltages. The collector-emitter circuit of the p-n-p transistor includes a source of negative potential to apply a reverse bias to the transistor collector-base junction as required to obtain transistor action, and a load resistor is connected in series with the negative bias source to enable the p-n-p transistor to go into saturated conduction in the well known manner when it is triggered.

In response to a triggering pulse, the n-p-n transistor is triggered into conduction by a positive pulse forward biasing its base-emitter junction while its base-collector junction is reverse biased during a positive half cycle of the clock voltage. Since the base-emitter junction of the p-n-p transistor is reverse biased, the clock source provides the required collector current for the remainder of its positive half cycle. At the beginning of the next succeeding negative half cycle of the clock source, the clock diode is biased Off and the n-p-n transistor collector current is thereafter supplied via the discharge of the previously charged inherent capacitance of the p-n-p transistor base-emitter junction, thus triggering the p-n-p transistor into saturated conduction to commence the production of the output voltage. The triggering pulse is removed at some time during the occurrence of the clock source negative half cycle mentioned above, thus tending to bias the n-p-n transistor Off. However, minority carriers stored in the base region of the p-n-p transistor maintain it at the saturated conduction level for a determinable time interval after the removal of the triggering pulse to continue the production of the output pulse. The beginning of the next succeeding clock source positive half cycle applies a relatively large positive potential to the collector electrode of the n-p-n transistor thereby driving majority carriers away from its base-collector junction to re-charge the inherent capacitance thereof, and simultaneously therewith the clock source positive half cycle applies the same positive potential to the p-n-p transistor base electrode thus driving the stored minority carriers from its base region into its collector region to re-charge the inherent capacitance of the latter base-collector junction. This re-charging of the inherent interelectrode capacitances reverse biases both transistors to the Off condition thereby abruptly terminating the generation of the output pulse.

A full understanding of the invention and the various advantages thereof may be obtained by a consideration of the following detailed description in connection with the attached drawings in which.

Figure 1:
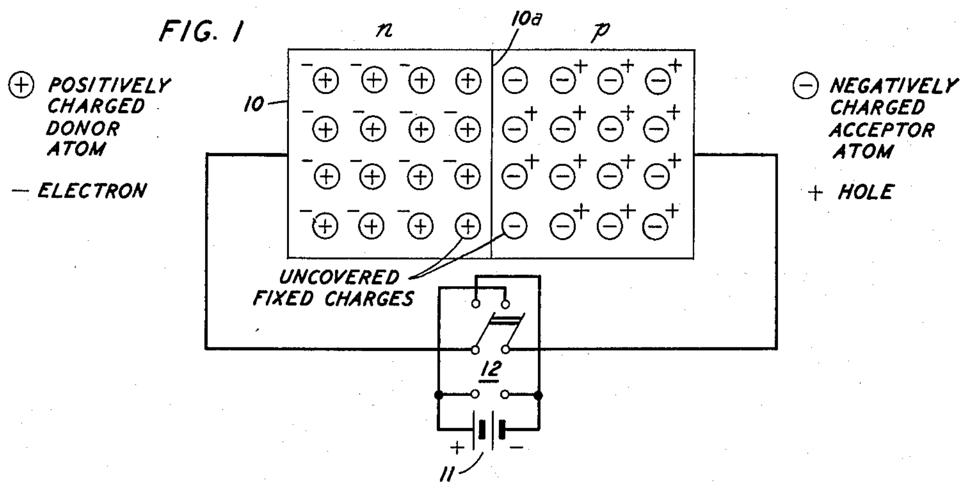
Figs. 1 and 2 are diagrammatic circuits and Fig. 3 is a family of curves facilitating an explanation of certain semiconductor phenomena.

A description of the connection and operation of the invention will be presented hereinafter to enable persons skilled in the art to construct and operate the same. First, however, in order to facilitate an understanding of the invention, a brief outline will be presented of currently accepted philosophies in regard to (1) apparent inherent interelectrode capacitive effects at semiconductor junctions and (2) collector current saturation in transistor devices. These philosophies are explained in greater detail in chapter 21 of F. E. Terman's book "Electronic and Radio Engineering," fourth edition, McGraw-Hill Book Company, Inc., New York.

A semiconductor is a material, such as silicon and the like, having a magnitude of resistance lying between the magnitude of resistance of materials that are generally considered to be electric insulators and the magnitude of resistance of materials that are generally considered to be electric conductors. The semiconductor material is made up of crystals comprising atoms bonded together by associations among the valence electrons of the atoms. Thermal agitation causes a few of the electrons to break their association and move about freely in the crystal lattice. The remaining positively charged atom is held fixed in its crystal lattice position. The broken electron association is restored by an adjacent electron transferred from its present association and leaving thereat a vacancy, or hole. The hole is thus also moved freely about the crystal lattice by the transfer of electrons from one association to another. If a free electron and a free hole should chance to come adjacent to one another, they combine. The application of an electric potential to the semiconductor material causes the electrons to drift to the positive terminal thereof and the holes to drift to the negative terminal thereof, with the total semiconductor electric current being the sum of the electron current and the hole current.

The thermally generated electrons and holes in pure semiconductor materials are relatively few in number.

Therefore, certain impurities are added to the semiconductor materials in small quantities to supply additional mobile electrons and holes leaving behind fixed positively charged and negatively charged atoms, respectively. If the added impurity supplies excess electrons, the resultant semiconductor material is called donor, or n-type, material; and if the impurity supplies excess holes, the resultant semiconductor material is called acceptor, or p-type, material.

Since there are excess electrons in n-type semiconductor material, they are called majority carriers of electric current whereas the holes in the same material are called minority carriers of electric current. Similarly, the excess holes in the p-type semiconductor material are called majority carriers, and the electrons in the same material are called minority carriers. Since the majority carriers in each material are of different polarities, the n-type and p-type materials are said to be of opposite conductivity types.

Referring to Fig. 1, there is schematically represented a semiconductor junction diode 10 comprising a portion of n-type material and a portion of p-type material joined together at a junction **10*a***. In the n-type material the encircled "+" sign represents a fixed positive charge due to a donor atom and the adjacent "−" sign represents an associated mobile negative charge, or electron. In the p-type material the encircled "−" sign represents a fixed negative charge due to an acceptor atom and the adjacent "+" sign represents an associated mobile positive charge, or hole.

The junction diode 10 illustrated in Fig. 1 is connected to a source 11 of direct current potential via a reversing switch 12. With switch 12 in its midposition, there is no external potential applied to the diode and it is said to be in a condition of equilibrium with no external bias. Initially, some holes combine with electrons at the junction **10*a*** so that their associated fixed charged atoms are left in a so-called uncovered condition.

The electrostatic field associated with the uncovered, fixed, positively charged, donor atoms in the n material repels mobile holes in the p material away from junction **10*a*; and in a similar manner the uncovered, fixed, negatively charged, acceptor atoms in the p material repel the mobile electrons in the n material away from junction 10*a***. Thus, on each side of the junction and immediately adjacent thereto are arrayed positive and negative charges due to the fixed, uncovered donor and acceptor atoms, respectively.

The uncovered charged atoms tend to attract thermally generated, or intrinsic, minority carriers across the junction **10*a* from the opposite side thereof. Some majority carriers acquire enough energy from thermal agitation effects within the respective semiconductor materials to enable them to cross the junction 10*a* in the opposite direction in spite of the electrostatic field established by the uncovered fixed charges. The movement of the intrinsic minority carriers across junction 10*a* constitutes a current which is effectively counter-balanced by the component of cross-junction current which is due to the thermally actuated majority carriers crossing the junction in the opposite direction. Thus, junction diode 10 is said to be in an equilibrium condition, with equal internal current flowing in opposite directions across the junction 10*a*** and with fixed charges arrayed on opposite sides thereof.

The semiconductor junction diode with opposite types of charges on the two sides of the junction is analogous to an ordinary capacitor, and such diode is therefore said to have an inherent capacitance between its electrodes. This inherent interelectrode capacitance can be charged or discharged by applying an external electric potential to the diode electrodes to change the number of uncovered, fixed charges at the junction. Thus, if the arm of switch 12 is positioned on its lower contacts to apply a reverse bias to the diode, that is, to connect the positive terminal of the source to the n material and the negative terminal thereof to the p material, additional mobile charges will be drawn away from the junction area toward the respective source terminals. The number of uncovered, fixed charges on each side of the junction is thereby increased, and the charge on the interelectrode capacitance is increased. The increased charge tends to inhibit the flow of electric current from source 11 through diode 10. Upon the reversal of the potential of source 11 to forward bias diode 10 via the arms of switch 12 positioned on its upper contacts, electrons (majority carriers) from the n material are caused to drift toward the junction, cross the junction (thereby becoming minority carriers in the p-type material), and diffuse through the p-type material toward the positive terminal of source 11. In a like manner the holes (majority carriers) in the p-type material drift toward the junction, cross it (thereby becoming minority carriers in the n-type material), and diffuse through the n-type material toward the negative terminal of source 11. Some of the majority carriers drifting toward the junction 10*a* recombine with the uncovered, fixed charges near the junction thereby decreasing the number of uncovered, fixed charges near the junction and decreasing the charge on the interelectrode capacitance. As the minority carriers diffuse away from the junction, some of them recombine with majority carriers drifting toward the junction so that the concentration of minority carriers (both intrinsic minority carriers and majority carriers which have crossed the junction to become minority carriers) is considerably higher near junction 10*a* in the forward bias condition than it is in the reverse bias condition.

If switch 12 is manipulated again from its upper contacts to its lower contacts to reapply a reverse bias to the diode 10, the concentration of minority carriers at junction 10*a* must be reduced to establish an equilibrium condition for the reverse bias situation. This is accomplished by recombinations of majority and minority carriers as they are drawn back across the junction by the reverse bias potential.

The above theories of semiconductor diode operation may also be applied to the junction triode transistor. Thus, referring to Fig. 2, a p-n-p transistor 13 comprises two portions of p-type material with a relatively thin intermediate portion of n-type material therebetween. The n-type material is designated the base region and is provided with a base electrode 14. The two portions of p-type material are respectively designated emitter and collector regions and are respectively provided with emitter and collector electrodes 16 and 17. The semiconductor junctions between the n-type material and each of the adjacent p portions can be considered a separate junction diode.

Figure 2:
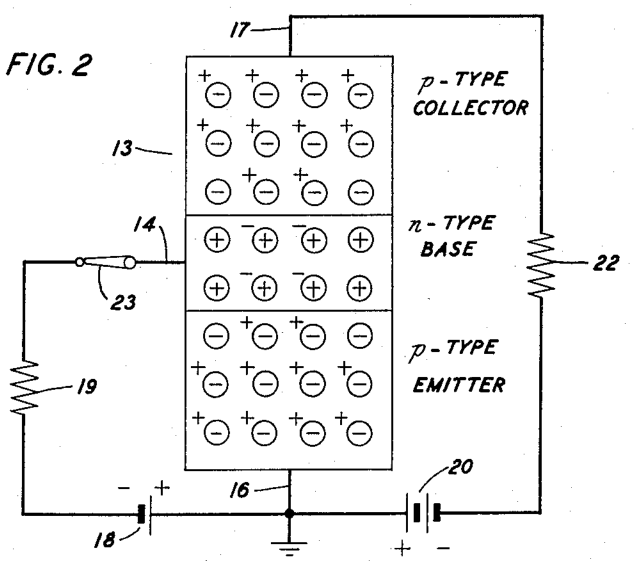

In operating the transistor shown in Fig. 2, the emitter-base diode is forward biased for easy current flow by direct current source 18 via resistor 19, emitter electrode 16 being positive with respect to base electrode 14 in a p-n-p transistor; and the collector-base diode is reversely biased by direct current source 20 via a load resistor 22, collector electrode 17 being negative with respect to the base electrode 14 in a p-n-p transistor. In this bias condition, carriers are drawn across the emitter-base junction by the forward bias applied thereto. However, most of these carriers diffuse toward collector electrode 17, cross the base-collector junction, and appear as electric current in collector electrode 17. This is called transistor action.

Only a very small proportion of the carriers from the emitter region appear as electric current in base electrode 14 because the base region thickness is relatively much smaller than the average minority carrier diffusion distance, i.e., the average distance that a minority carrier diffuses prior to recombination.

Transistor 13 has an inherent interelectrode capacitance across each of its junctions which is similar to the junction capacitance described above in connection with diode 10. Likewise, if base electrode 14 were open circuited by opening switch 23, the external biases would be removed from both junctions and the charges on the interelectrode capacitances thereat would in time readjust themselves to establish the equilibrium charge conditions for zero external bias. Thus, if the base electrode circuit were alternately opened and closed, as by the cyclic manipulation of switch 23, the inherent interelectrode capacitances of the transistor would be alternately charged and discharged and the potential, which would appear across the base-emitter junction, for example, would be similar to the potential that would appear across a conventional capacitor connected across the output of a half wave rectifier.

Figure 3:
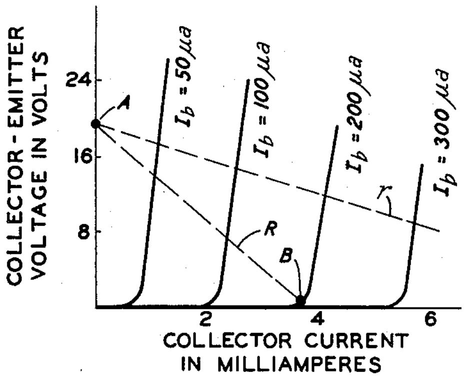

Turning now to the question of collector current saturation in a triode junction transistor, there is illustrated in Fig. 3 a set of collector-emitter voltage versus collector current characteristic curves for a transistor connected in a common emitter circuit as shown in Fig. 2. Two load lines are indicated, one designated R and the other designated *r*. Line R may indicate an assumed load of 5000 ohms while line *r* may indicate an assumed load of 500 ohms. With the load R and zero current in base electrode 14 (switch 23 open), transistor 13 in Fig. 2 rests at operating point A in Fig. 3, with the indicated value of applied collector-emitter voltage say, for example, 19 volts. When switch 23 is closed and a current of about 200 microamperes flows in base electrode 14 transistor 13 then rests at operating point B with a much smaller applied collector-emitter potential say, for example, 50 millivolts. It is thus apparent from Fig. 3 that with load *r* the collector-emitter potential could not be reduced to a value below approximately 10 volts within the indicated range of practical amounts of current for base electrode 14.

Referring to Figs. 2 and 3, it has been found that a value can be chosen for resistor 22, relative to the terminal voltage of source 20 and the forward bias that may be applied to the transistor base-emitter junction by source 18 via resistor 19, which will produce an operating point for transistor 13 with switch 23 closed at which the potential of collector electrode 17 with respect to ground is less negative than the potential of base electrode 14 with respect to ground. When switch 23 is closed with the circuit configuration of Fig. 3, a voltage is applied to the base-emitter junction of transistor 13 to initiate transistor action as outlined above. Collector current builds up rapidly until the collector-base junction, which was originally reversely biased by source 20, becomes less negatively biased than base electrode 14. In other words, the collector-base junction becomes forward biased. The collector region of transistor 13 begins to emit holes into the base region in addition to those holes emitted thereinto from the emitter region. Thus, the collector region of the transistor is supplying sufficient charges to maintain current flow from the collector electrode through the load resistor to the emitter region, and is maintaining a flow of holes from the collector region to the base region. In this state of operation the collector current is at its maximum, or saturated, value because all holes in excess of those necessary to maintain this saturated collector current are emitted by the collector into the base region of transistor 13.

As noted previously in the case of a junction diode subjected to forward bias, the concentration of holes in the n-type material is much higher near the junction than it is at the portions more remote therefrom. Similarly, the hole concentration near the base-emitter junction of transistor 13 is high. When transistor 13 is in saturated conduction, with holes being emitted from the collector region into the base region, the hole concentration is also high near the base-collector junction. Since the base region of transistor 13 is quite narrow, the holes are unable to recombine fast enough to reduce the concentration so that the excess holes are in effect stored in the base region. When the negative voltage is removed from base electrode 14 by opening switch 23, the excess holes stored in the base region are drawn into the collector region by the negative collector potential, and they appear as electric current in collector electrode 17. In spite of the fact that the stored holes recombine with electrons as they move toward collector electrode 17, it has been found that there is a sufficient store of holes in the base region to maintain collector current for a time interval of the order of 30 microseconds, including a substantial interval of conduction at the saturated level. It has been found further that the total conduction time of collector electrode 17 after the opening of switch 23 can be reduced to a small fraction of a microsecond by applying a positive potential to base electrode 14. Such a positive potential aids the negative collector potential by driving the excess holes into the collector region and in this way cutting off collector current quite rapidly.

Figure 4:
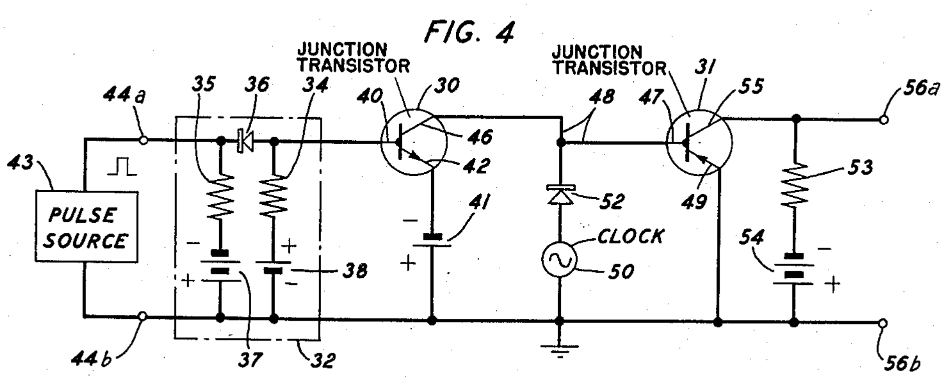
Fig. 4 is a schematic circuit diagram of two direct-coupled transistor amplifier stages embodying the invention.

Referring to Fig. 4 there is illustrated a transistor pulse amplifier which includes an n-p-n junction transistor 30 and a p-n-p junction transistor 31 arranged in tandem, common emitter, amplifier stages. The amplifier input circuit includes logic circuitry 32 comprising the resistors 34 and 35, diode 36, and sources 37 and 38 of direct current potential. Diode 36, resistor 35, and source 37 are connected in series in the order named between base electrode 40 and a reference potential point such as ground. Diode 36 is poled for forward conduction away from base electrode 40. Resistor 34 and the source 38 are connected in series in the order named between base electrode 40 and ground thereby forming in logic circuit 32 a closed loop circuit with diode 36, resistor 35, and source 37. The magnitudes of the resistors and the potential sources of logic circuitry 32 are so proportioned that base electrode 40 is normally held at some negative potential such as (—) 4 volts with respect to ground. A source 41 of direct current potential is connected between emitter electrode 42 and ground to apply a negative bias of the order of (—) 3 volts to emitter electrode 42. It is therefore apparent that a net negative potential of approximately 1 volt is normally applied across the base-emitter junction of transistor 30; this junction is therefore reversely biased; and transistor 30 is Off since no transistor action takes place with the base-emitter junction reversely biased. Pulses for amplification are supplied from a pulse source 43 to amplifier input terminals *44a* and *44b*. Terminal *44a* is connected to a point intermediate resistor 35 and diode 36 while terminal *44b* is connected to ground.

As shown in Fig. 4, there are no feedback connections to the above-described amplifier input circuit from the amplifier output. Accordingly, the signal level in the input to transistor 30 is independent of the signal level in the amplifier output.

Collector electrode 46 of transistor 30 and base electrode 47 of transistor 31 are interconnected by a direct metallic connection in the form of a lead 48. Emitter electrode 49 of transistor 31 is connected directly to ground. A source 50 of alternating, or clocking, potential is provided in the interstage connections between transistors 30 and 31. One terminal of the clock source 50 is connected to lead 48 via the diode 52 which is poled for conduction of positive half cycles of the alternating potential source output wave from source 50 to lead 48. The other terminal of clock source 50 is connected directly to ground.

Positive half cycles of the output wave from clock source 50 are applied via diode 52 and lead 48 to the collector electrode 46 of transistor 30 and to the base electrode 47 of transistor 31. The positive potential tends to increase the number of uncovered fixed charges on each side of the respective transistor junctions thereby charging the inherent interelectrode capacitances of the base-collector junction of transistor 30 and the base-emitter junction of transistor 31. During the negative half cycle of the clock potential, some of the uncovered fixed charges recombine with thermally generated majority carriers thereby reducing the inherent stored reverse bias potential appearing across the respective junctions. Sufficient charge is maintained on the base-collector interelectrode capacitance to hold most of the reverse bias on the base-collector junction of transistor 30. Likewise the inherent interelectrode capacitance of the base-emitter junction of transistor 31 maintains sufficient reverse bias thereon to prevent transistor 31 from being triggered prematurely by noise voltages. The maximum charge condition on the base-emitter junction of transistor 31 is restored during the next succeeding positive half cycle output of clock source 50 as illustrated by the waveform $V_b$ of Fig. 5 which represents the potential between base electrode 47 and ground. The base-collector junction of transistor 30 is thus reversely biased as required for normal transistor action whenever transistor 30 should be biased On, and the base-emitter junction of transistor 31 is reversely biased to hold transistor 31 Off.

An output circuit is provided for the amplifier and comprises a load resistor 53 and a potential source 54 connected in series in the order named between collector electrode 55 of transistor 31 and ground. Source 54 tends to apply a negative potential to collector electrode 55 thereby reversely biasing the collector-base junction of transistor 31 as required for transistor action when transistor 31 should be biased On. Resistor 53 is so proportioned with respect to source 54 and base current signals that will be applied to base electrode 47 from transistor 30 in the first stage of the amplifier that transistor 31 will be triggered into conduction with saturated collector current as described above in connection with Figs. 2 and 3. A pair of output terminals *56a* and *56b* are connected respectively to collector electrode 55 and ground. Since the only signal coupling between amplifier input and output is the forward coupling path via transistors 30 and 31, the above-described output circuit is otherwise isolated from the amplifier input circuit.

Figure 5:
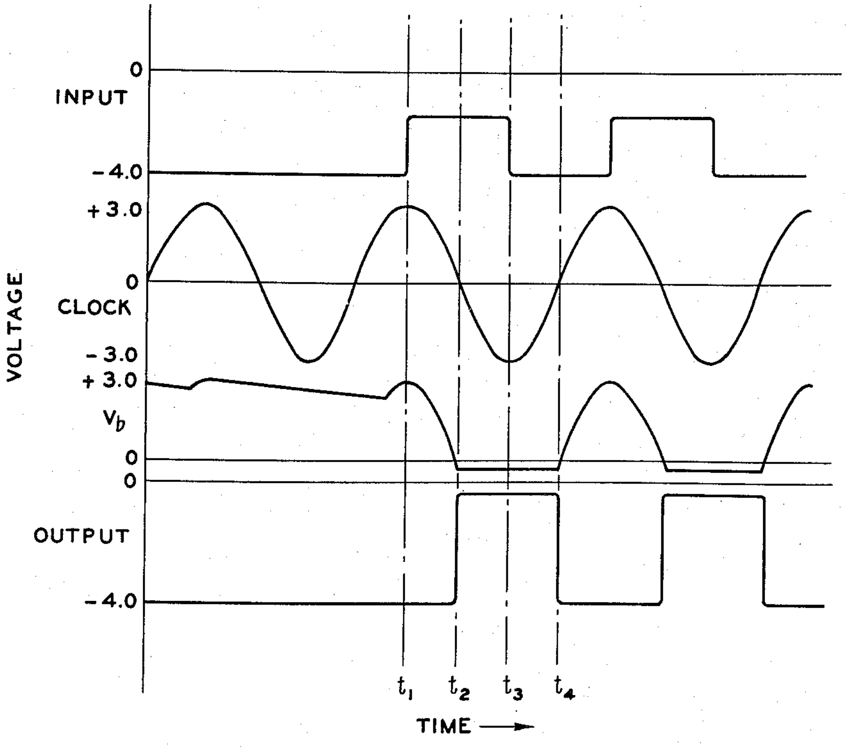
Fig. 5 is a series of voltage waveforms illustrating the operation of the circuit of Fig. 4.

Turning now to the operation of the invention, a consideration of the circuit of Fig. 4 in connection with the waveforms of Fig. 5 will facilitate an understanding thereof. Referring to Fig. 5, the input wave applied between terminals *44a* and *44b* comprises a series of positive-going pulses having a base potential of approximately (—) 4 volts; the clock waveform is a one megacycle sinusoidal wave appearing at the terminals of clock source 50 and having substantially equal positive and negative portions with a peak value of approximately 3 volts; the waveform $V_b$ represents the voltage appearing between base electrtode 47 and ground; and the output waveform represents the potential appearing between terminals *56a* and *56b* having a base of approximately (—) 4.0 volts and including flat-topped, positive-going pulses which extend approximately to ground potential. All of the waveforms of Fig. 5 are plotted against the same time scale.

An input pulse is applied from pulse source 43 to the amplifier input terminals *44a* and *44b* at time $t_1$ during a positive half cycle of the output wave of clock source 50. This input pulse drives the left side of diode 36 to a potential which is less negative than that on base electrode 40 thereby biasing diode 36 Off. The positive potential of source 38 is then applied to base electrode 40, and sources 38 and 41 together apply a forward bias, i.e., a positive pulse, to the base-emitter junction of transistor 30. Since the base-collector junction of transistor 30 is reversely biased at time $t_1$ by clock source 50, transistor action commences in the well known manner and collector current begins to flow in collector electrode 46. The base-emitter junction of transistor 31 is reversely biased at $t_1$ as evidenced by the fact that voltage $V_b$ is then positive so collector current for transistor 30 must be supplied from clock source 50 via diode 52 and lead 48.

The collector current in transistor 30 builds up during the time interval between times $t_1$ and $t_2$. At time $t_2$ the output wave of clock source 50 crosses the zero voltage axis passing from its positive half cycle to its negative half cycle thereby applying a reverse bias to diode 52 which turns diode 52 Off. However, even in its conducting condition, diode 52 has a determinable impedance and therefore there is a certain potential drop thereacross during conduct. Thus at time $t_2$, when the output wave of clock source 50 is crossing the zero voltage axis, the voltage $V_b$ has a slightly negative value with respect to ground as illustrated in Fig. 5; and this slight negative potential constitutes a pulse of sufficient magnitude to forward bias the base-emitter junction of transistor 31, discharging the interelectrode capacitance across the junction, and drawing a current from base electrode 47 which triggers transistor 31 into conduction. As noted above, resistor 53, source 54 and the initial slight negative value of voltage $V_b$ at time $t_2$ are so proportioned in the well known manner that the flow of collector current through load resistor 53 promptly drives the potential of output terminal 56a from its large negative value corersponding to the terminal voltage of source 54 to a small negative value which is numerically less negative than the value of voltage $V_b$ between time $t_2$ and time $t_3$. The base-collector junction of transistor 31 thus becomes forward biased even though collector electrode 55 is negative with respect to emitter electrode 49. Transistor 31 is thus in saturated conduction; and, beginning at time $t_2$, the generation of a flat-topped output pulse illustrated in Fig. 5 commences between amplifier output terminals 56a and 56b.

The input pulse is terminated at time $t_3$ during the negative half cycle of the output wave of clock source 50 which next succeeds the positive half cycle during which the same input pulse started. Diode 36 is thereby forward biased, and the loop circuit from source 38 through resistor 34, diode 36, resistor 35, and source 37 in logic circuit 32 is re-established. Base electrode 40 is negatively biased with respect to ground by the potential drops in the loop of logic circuitry 32, and transistor 30 is biased Off.

When transistor 30 is biased Off at time $t_3$ there is a substantial concentration of minority carriers or holes stored in the n-type base region of transistor 31. These stored holes now begin to diffuse throughout the base region of transistor 31 and those which come close to the base-collector junction are drawn across the junction by the negative potential applied to collector electrode 55 by source 54. This latter action maintains collector current flow at the saturated level for the time interval between times $t_3$ and $t_4$, and thus in that time interval the flat-topped amplifier output pulse is maintained, even though the amplifier input pulse has been terminated and no external bias potentials are then applied to the lead 48 which directly couples collector electrode 46 of the first stage and base electrode 47 of the second stage.

At time $t_4$ the output wave of clock source 50 crosses the zero voltage axis passing from its negative half cycle to its next succeeding positive half cycle thereby biasing diode 52 On and applying a positive potential to collector electrode 46 and base electrode 47. The positive potential on collector electrode 46 tends to draw electrons stored in the base region of transistor 30 across the base-collector junction into the collector region and away from the base-collector junction thereby re-charging the inherent interelectrode capacitance across the junction. In a similar manner the positive potential applied to base electrode 47 drives the holes stored in the bias region of transistor 31 across the base-collector junction into the collector region where they can readily combine with fixed negative charges and be removed from the junction area to re-charge the inherent interelectrode capacitance across the base-collector junction. The re-charge of the inherent interelectrode capacitances causes a cessation of the action in both transistors thereby terminating the generation of the output amplifier pulse abruptly at the time $t_4$.

It is to be understood that while the invention has been described as exemplified in a particular embodiment thereof, it is not so limited. Many other modifications will be apparent to those skilled in the art without departing from the spirit and scope of the invention.

What is claimed is:

1. In a transistor pulse amplifier comprising two junction transistors of opposite conductivity types, each of said transistors having a base electrode and collector and emitter electrodes, each of said transistors having inherent interelectrode capacitances across the junctions thereof, an amplifier input circuit connected between said first transistor base and emitter electrodes, means in said amplifier input circuit for applying a reverse bias to said first transistor base-emitter junction in the absence of input pulses, an amplifier output circuit including a source of operating potential, and a source of input pulses, the improvement in said amplifier comprising a low impedance direct connection between said first transistor collector electrode and said second transistor base electrode, a source of alternating potential, a half wave rectifier, means for applying the positive half cycles of the output potential of said source of alternating potential to said direct connection via said rectifier for charging the capacitance across the collector-base junction of said first transistor and the base-emitter junction of said second transistor thereby reversely biasing the two last-mentioned junctions, said positive half cycles being the only bias potential applied to said direct connection by circuit means exclusive of said transistors, means including the inherent capacitances across said two last-mentioned junctions, after being charged, for maintaining a reverse bias on such junctions during negative half cycles of the output from said alternating potential source, means for applying a pulse from said input pulse source to said input circuit during a positive half cycle of the output from said alternating potential source and terminating said input pulse before the end of the next succeeding negative half cycle of the output of said alternating potential source to trigger said first transistor into conduction for the duration of said pulse thereby producing a current pulse in said direct connection, said current pulse triggering said second transistor into saturated conduction at the beginning of said negative half cycle thereby producing an output pulse in said output circuit and storing current carriers in said second transistor, means including said operating potential source and said stored current carriers maintaining conduction in said second transistor collector electrode at the saturated level during the last portion of said negative half cycle following the termination of said current pulse, and said alternating potential source and said rectifier applying a subsequent positive half cycle of said alternating potential source output potential to said second transistor emitter-base junction for reducing the concentration of said stored current carriers in said second transistor and terminating said output pulse.

2. A transistor pulse amplifier comprising first and second junction transistors each having at least three electrodes, an input circuit connected between two electrodes of said first transistor, said input circuit comprising means applying pulses to said amplifier and means normally biasing said first transistor Off in the absence of a pulse from said source, an output circuit connected between two electrodes of said second transistor, means tending to bias said second transistor Off in the absence of a triggering pulse at the third electrode thereof, the last-mentioned means comprising a source of alternating potential and a diode connected in series between the third electrode of said second transistor and said output circuit for applying alternate half cycles of the output from said alternating potential source to said second transistor, a direct connection between the third electrodes of said transistors for applying a triggering pulse to said second transistor in response to the coincidence of a pulse in said input circuit with the termination of one of said alternate half cycles, and means in said output circuit driving said second transistor into saturated conduction in response to said triggering pulse for storing minority carriers in said second transistor, said carriers maintaining said second transistor in conduction until said second transistor is again biased non-conducting by a succeeding one of said alternate half cycles.

References Cited in the file of this patent

UNITED STATES PATENTS

| | | |
|---|---|---|
| 2,576,026 | Meacham | Nov. 20, 1951 |
| 2,627,039 | MacWilliams | Jan. 27, 1953 |
| 2,657,318 | Rack | Oct. 27, 1953 |
| 2,705,287 | Lo | Mar. 29, 1955 |
| 2,760,087 | Felker | Aug. 21, 1956 |
| 2,774,875 | Keonjan et al. | Dec. 18, 1956 |
| 2,810,832 | Broadhead | Oct. 22, 1957 |

FOREIGN PATENTS

| | | |
|---|---|---|
| 764,100 | Great Britain | Dec. 11, 1956 |
| 1,084,604 | France | July 7, 1954 |
| 1,119,708 | France | Apr. 9, 1956 |